United States Patent [19]
Tada et al.

[11] Patent Number: 5,297,101
[45] Date of Patent: Mar. 22, 1994

[54] PROM IC WITH A MARGIN TEST FUNCTION

[75] Inventors: Yoshihiro Tada; Hiromi Uenoyama, both of Kyoto, Japan

[73] Assignee: Rohm Co., Ltd., Kyoto, Japan

[21] Appl. No.: 960,807

[22] Filed: Oct. 14, 1992

[30] Foreign Application Priority Data

Oct. 16, 1991 [JP] Japan ................................. 3-296479

[51] Int. Cl.$^5$ ............................................. G11C 13/00
[52] U.S. Cl. ................................ 365/230.01; 365/185; 365/201
[58] Field of Search ..................... 365/230.01, 201, 185

[56] References Cited

U.S. PATENT DOCUMENTS

| | | | |
|---|---|---|---|
| 4,779,272 | 10/1988 | Kohda et al. | 365/185 |
| 5,142,496 | 8/1992 | Van Buskirk | 365/201 |

Primary Examiner—Eugene R. LaRoche
Assistant Examiner—Frank R. Niranjan
Attorney, Agent, or Firm—Fay, Sharpe, Beall, Fagan, Minnich & McKee

[57] ABSTRACT

A PROM IC including sense circuits, each including a sense amplifier. A pull-up resistor circuit whose resistance value is variable is provided on the side of an input of the sense amplifier so that, upon a reception of a test selection signal, the resistance value of the resistor circuit is changed to a value with which a drive condition of current flowing through a selected memory cell becomes severe.

4 Claims, 4 Drawing Sheets

PROM IC WITH A MARGIN TEST FUNCTION

BACKGROUND OF THE INVENTION

1. Technical Field

The present invention relates to a PROM IC and, particularly, to such PROM IC capable of executing a margin test for memory state of respective memory cells of such as EPROM or EEPROM, etc., under severe conditions and capable of selecting reliable memory IC.

2. Prior Art

Non-volatile read-only memory includes mask read-only memory (ROM) which is not erasable and programmable read-only memory (PROM). PROM includes erasable programmable read-only memory (EPROM) and electrically erasable programmable read-only memory (EEPROM).

PROM can generally be classified into the fuse type which is writable only once, such type as FAMOS which is rewritable by avalanche breakdown after erase by ultraviolet ray and such type as MNOS which is electrically erasable/rewritable by tunnel effect. A PROM IC includes a matrix of memory cells of any of the above mentioned types constituting a memory array. A general construction of the PROM IC is shown in block in FIG. 3.

In FIG. 3, a memory cell array 1 is constituted with a plurality of memory cells 1a, 1b, . . . arranged in a column and row matrix.

A column decoder 2 is responsive to an address signal A indicating a column address A to select a column having an address A and a row decoder 4 is responsive to the signal A to select a row having an address A, so that one of the memory cells which is arranged in a position defined by the column address A and the row address A is selected.

A read voltage from a read voltage application circuit 3 is applied to the thus selected memory cell through the column decoder 2 and a read signal from the selected memory cell corresponding to an information written in the memory cell is amplified by one of sense circuits 5a, 5b, . . . corresponding thereto to provide a binary one value. An output of the sense amplifier is inverted to the other value in response to an input voltage exceeding a predetermined threshold value.

The read voltage application circuit 3 is responsive to a test selection signal T to switch the read voltage to be applied to any of the memory cells through the column decoder 2 from a standard read voltage S to an external application voltage E. An operational relation among the read voltage application circuit 3, the memory cell and one of the sense circuits and hence sense amplifiers SA thereof corresponding thereto (in this example, sense circuit 5c) will be described with reference to FIG. 4. It should be noted that the test signal T is produced correspondingly to a signal externally set for selection of test state.

In FIG. 4, it is assumed that a memory cell 1c of the PROM IC is selected by the address signal supplied to the column address decoder 2 and the row decoder 4. For clarification of illustration, other memory cells are omitted and the column decoder 2 and the row decoder 4 are shown by mere dotted lines respectively. Since, in this example, the memory cell 1c is composed of a floating type transistor Qc, the read voltage is applied through the column decoder 2 to a gate electrode of the transistor Qc.

With absence of test selection signal T, that is, during a normal read, the transistor Qb of the read voltage application circuit 3 is in "OFF" state. Therefore, a predetermined standard read voltage S is applied by the read voltage application circuit 3 to the gate electrode of the transistor Qc. On the other hand, when a test selection signal T is supplied externally, that is, a performance test such as marginal test is to be performed, the transistor Qb is turned "ON" and the external application voltage E is supplied through a test terminal of a PROM IC or any other external terminal to the gate electrode of the transistor Qc of the memory cell 1c as a read voltage to read a stored information. For test, a storing state of the memory cell 1c, that is, a capturing state of electrons or holes at the floating gate of the transistor Qc is detected by the sense circuit 5c connected through the row decoder 4 to a drain electrode of the transistor Qc. The detection is performed by applying a predetermined reading voltage to the gate electrode of the transistor Qc and detecting a current drive capability of the transistor Qc.

Describing this in more detail, an input of the sense amplifier SA of the sense circuit 5c is connected to the drain of the transistor Qc and its potential is pulled-up by a source voltage Vcc through a resistor R1 whose value is several hundreds K ohms to several M ohms usually. Therefore, when the predetermined reading voltage is applied to the gate of the transistor Qc, a read current whose value corresponds to the read voltage flows from the source Vcc to the transistor Qc. With this current flow, a corresponding voltage drop occurs across the resistor R1, which is used as a read signal. The read signal is amplified by the sense amplifier SA and binarized thereby according to the voltage value thereof. The binarized output of the sense amplifier SA is supplied from the IC externally.

On the other hand, a threshold voltage of a floating type transistor at which the latter transistor is "ON"/"OFF" operated is determined by the degree of capture of electron or hole at the floating gate. Further, when the read voltage is higher than the threshold value, the transistor is turned "ON" and, when lower, it is turned "OFF". Therefore, it is possible to obtain a state in which a normal value written in the memory cell is output, correspondingly to the voltage value applied to the gate of the same transistor and thus to detect the storing state of the same memory cell.

In order to test the written state of the selected memory cell, that is, in order to test the degree of capture of electron or hole at the floating gate of the transistor Qc, the read voltage is switched from the standard read voltage S to the externally applied voltage E which may be lower than the standard read voltage, with which the written state of the selected memory cell is detected as a binary output thereof.

Thus, by reading the information written in the memory cell by means of the externally supplied read voltage E, it is possible to perform a marginal test for an actual read condition and to thereby supply only PROM IC's whose performance is more stable as products.

There may be a case where a sufficient marginal test is impossible, dependent upon the type of the memory cell. In detail, in the floating gate type transistor as the memory cell, when the floating gate captures holes or discharge electrons to make the transistor of depletion type, the marginal test is impossible. That is, in order to perform a marginal test when the transistor forming the memory cell becomes depletion type, the externally applied read voltage E must be set to a negative value possibly as low as −4 V. With such negative read voltage, a terminal for applying the external application voltage E or a path extending therefrom to a transistor of a selected memory cell of the floating type transistor memory is short-circuited to a ground terminal due to an effect of a parasitic diode existing in a portion of the path, making the performance test impossible.

Therefore, in the past, it has been practically impossible to perform a sufficient test of a memory unless such marginal test is performed for a wafer having only a circuit dedicated to such test or for memories which are subjected to destructive test. So far, marginal test of mass-produced PROM IC's is performed by applying external application voltage of 0 V at most and therefore reliability of such PROM IC's is not enough.

SUMMARY OF THE INVENTION

An object of the present invention is to provide a PROM IC which is compatible with a conventional product, is capable of being performance-tested under severe condition compared with conventional test condition and is more reliable as a product.

Another object of the present invention is to select PROM IC's which are capable of being tested as packaged products and are highly reliable, as products.

A feature of a PROM IC according to the present invention resides in that a value of a pull-up resistor provided in an input side of a sense amplifier of a sense circuit can be set to a smaller value than that used as a memory according to a test selection signal T.

According to the present invention, the PROM IC comprises a read voltage application circuit responsive to a test selection signal for switching the read voltage from a standard read voltage to an externally supplied voltage, a plurality of memory cells, address decoders and sense circuits each including a sense amplifier having a pull-up resistor circuit in an input side thereof.

The address decoders are responsive to an address signal to select one of the memory cells corresponding thereto.

Upon the test selection signal, the read voltage application circuit applies the external voltage to the selected memory cell and the value of the resistor circuit is switched from the standard value to a value with which drive current pulled in from a power source Vcc by the selected memory cell becomes more severe so that the input side of the sense amplifier is pulled-up by the power source and a stored information in the selected memory cell is detected thereby.

In the PROM IC constructed as mentioned above, when the storing state of the selected memory cell is tested, the pull-up resistor is set to a value with which more severe drive current condition is produced. Therefore, the test condition for the selected memory cell becomes severe and thus it is possible to perform performance test thereof such as a marginal test under such severe condition.

As a result, memory cells that have passed such a severe test necessarily have larger margin than that of the conventional one causing only reliable PROM IC's to be selected.

Further, since such IC does not require any additional external terminal, it is completely compatible with the conventional IC. Further, an IC packaged, that is, the IC in a state of a product can be tested under more a severe condition than that of the conventional product, and therefore it is possible to mass-produce reliable PROM IC's.

DETAILED DESCRIPTION OF THE PREFERRED EMBODIMENTS

Figure 1:
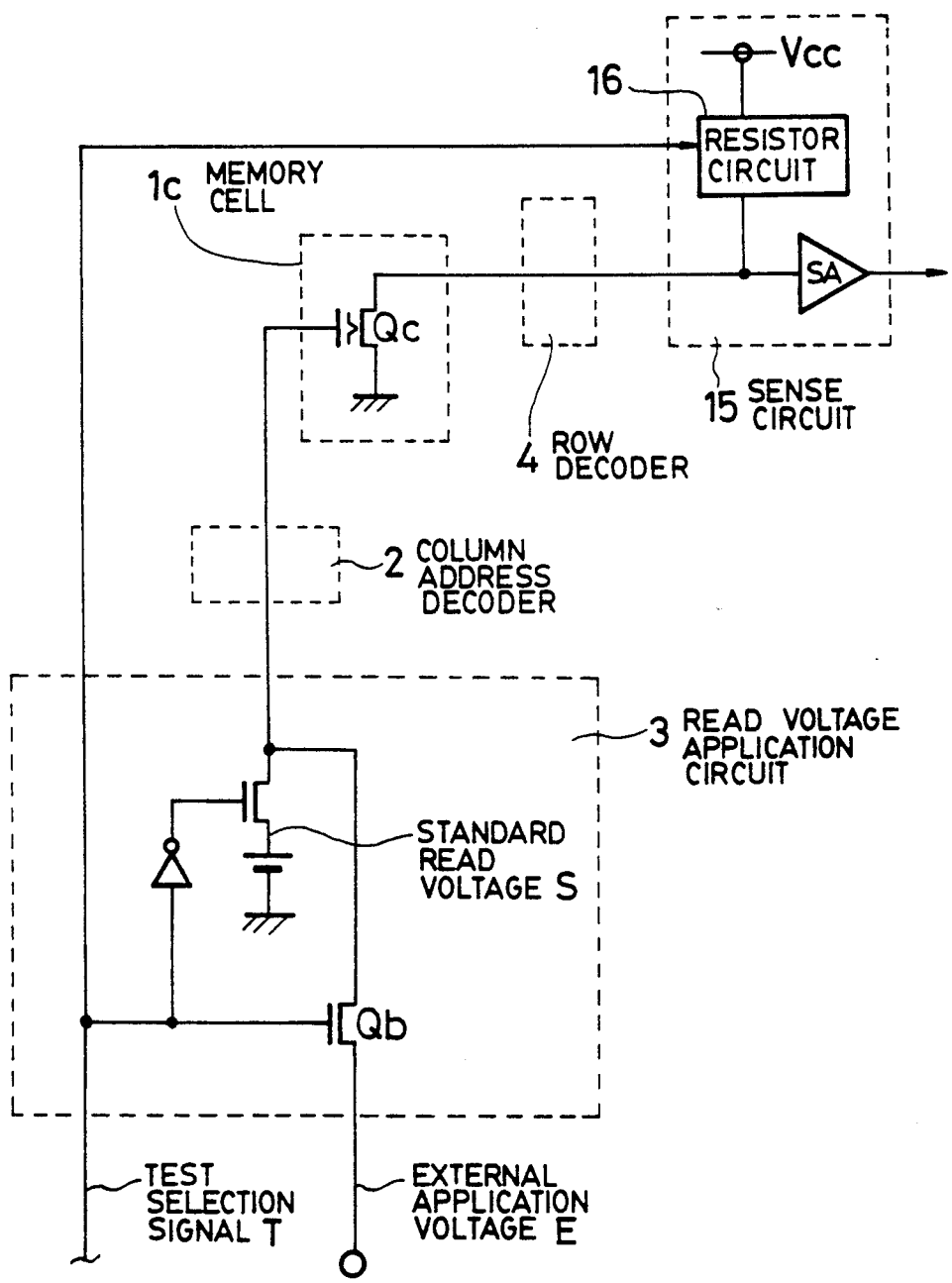
FIG. 1 is a block circuit diagram of a PROM IC according to an embodiment of the present invention, showing a memory cell portion during a test, mainly.
Figure 3:
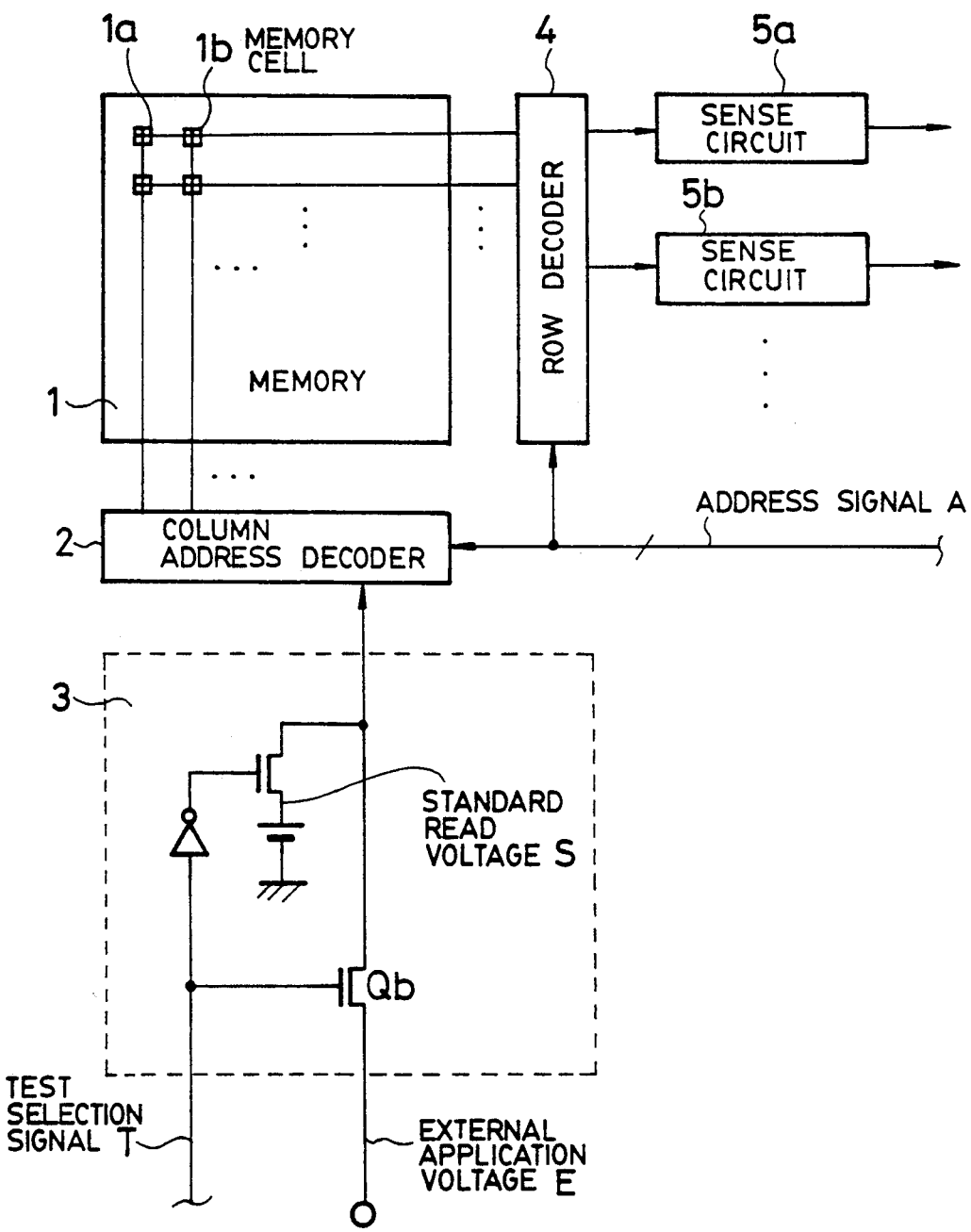
FIG. 3 is a block circuit diagram showing a general construction of a PROM IC including a test circuit.
Figure 4:
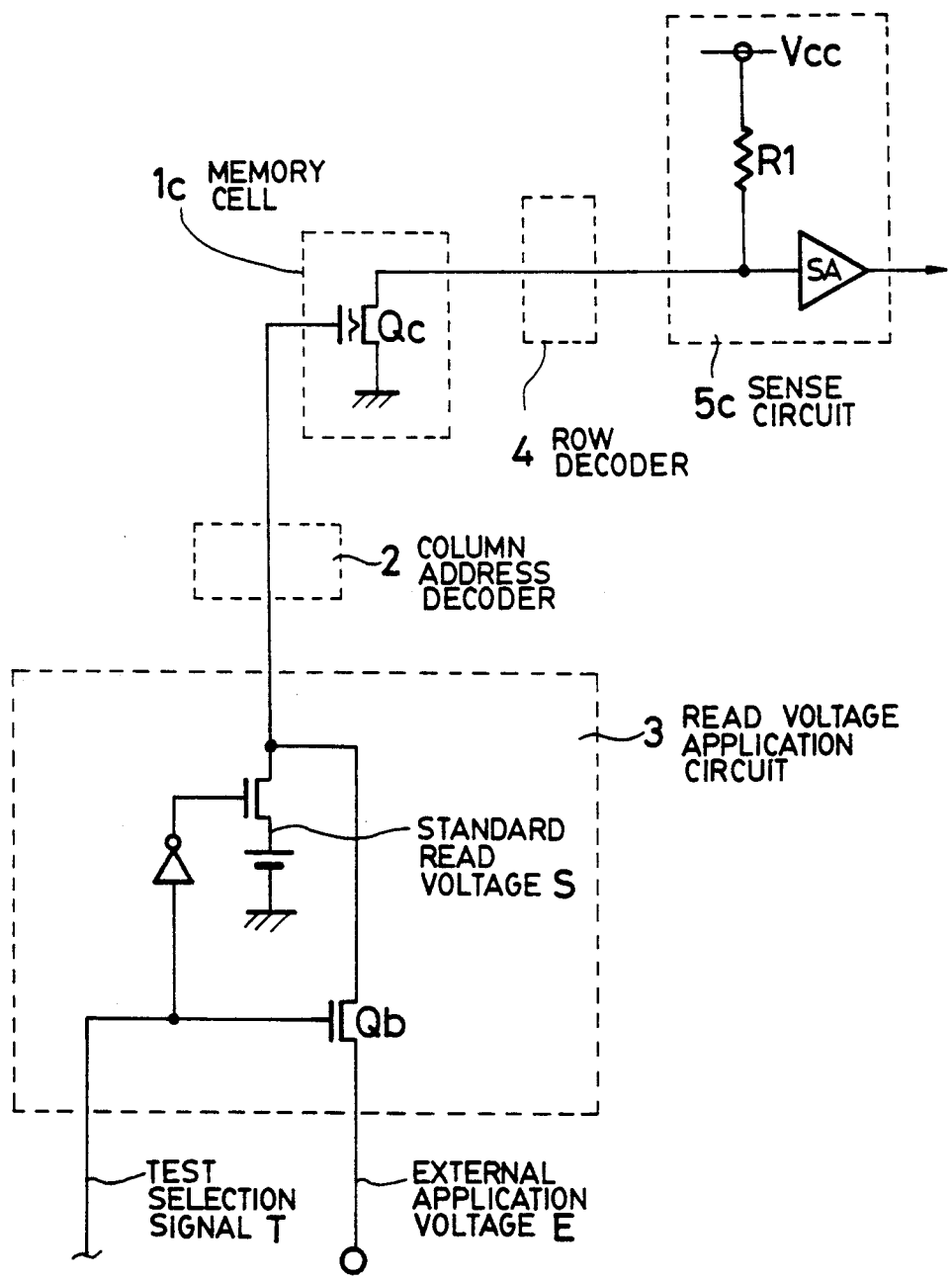
FIG. 4 is a block circuit diagram of a conventional PROM IC showing a memory cell portion to be tested, mainly.

A circuit shown in FIG. 1 corresponds to that shown in FIG. 4 except that FIG. 1 shows a sense circuit 15 instead of the sense circuit 5 in FIG. 4. In FIGS. 1 and 2, the same constitutional components as those shown in FIGS. 3 and 4 are depicted by the same reference numerals, respectively, and, so details thereof are omitted in the following description for avoidance of duplication.

The sense circuit 15 includes a resistor circuit 16 for receiving a test selection signal T, instead of the conventional pull-up resistor R1 whose value is several hundreds K to several M ohms. The resistor circuit 16 is connected between a source Vcc and an input of a sense amplifier SA thereof to pull-up the input side by the source Vcc. A resistance value of the resistor circuit 16 is substantially the same as that of the resistor R1 during a normal condition, that is, where there is no test selection signal T, and a becomes much smaller value than that of the resistor R1, for example, several K to several tens K ohms, when it receives the test selection signal T.

During the test, when an external voltage E is applied through a read voltage application circuit 3 to a gate of a transistor Qc constituting a selected memory cell 1c, a larger drive current than usual current is pulled in a drain of the transistor Qc from the power source Vcc through the resistor circuit 16 having a small resistance value. On the other hand, when the same usual current flows, a voltage drop across the resistor circuit 16 is reduced, causing read information detection by the sense amplifier SA to become more difficult.

In general, an information is written in a memory cell having a floating gate when an electric charge, that is, electron or hole accumulates therein. Degradation of written information is caused by leakage of such charge. When an information is written in a memory cell which is in an erased state, the floating gate of the transistor constituting the same memory cell is supplemented with positive charge. The threshold value thereof is about −2 V which is changed to 0 V or toward the positive side when leakage of charge occurs. When the read voltage approaches the threshold value, the transistor is saturated. Therefore, the "ON" resistance of the transistor is increased, resulting in degradation of the current drive capability. For this reason, the marginal test is performed with the read voltage of 0 V in the past. In this scheme, however, it is possible to detect only a defective memory cell whose threshold value is substantially 0 V due to charge leakage and whose current drive capability is lowered. On the other hand, in such case as mentioned above in which a marginal test is performed by making the resistance value of the pull-up resistor as small as, for example, several k to several tens k ohms and using read voltage of 0 V, it is possible to detect a defective memory cells whose threshold value is about −0.5 V or lower and whose current drive capability is reduced. Therefore, the reliability of PROM IC's passed through the marginal test can be improved much.

FIG. 2 shows the resistor circuit 16 in more detail. As mentioned previously, the resistor circuit 16 is responsive to a test selection signal T to change its resistance value.

Figure 2A:
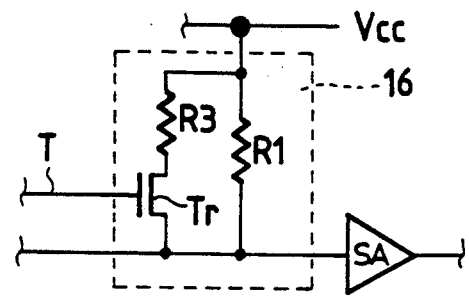
FIG. 2, consisting of FIGS. 2(a)–2(d), shows circuit construction of a pull-up resistor circuit in the PROM IC shown in FIG. 1.
Figure 2B:
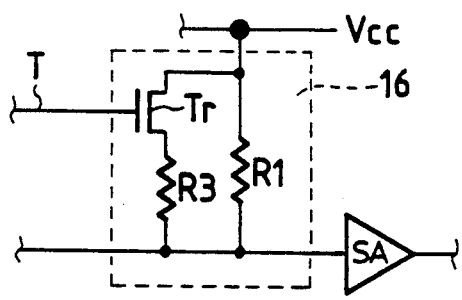

In FIGS. 2a and 2b, the resistor circuit 16 comprises a resistor R1 connected between the power source Vcc and an input of the sense amplifier SA and a series circuit of a transistor Tr and a resistor R3, connected in parallel to the resistor R1. In FIG. 2a, the resistor R3 of the series circuit is arranged in the power source side and, in FIG. 2b, the transistor Tr of the series circuit is arranged in the power source side. In either FIG. 2a or 2b, when there is no test selection signal T, the transistor Tr is in OFF state and thus the resistance value of the resistor circuit 16 is that of the resistor R1. On the other hand, when a test selection signal T is supplied to a gate electrode of the transistor Tr, the latter assumes the ON state and the resistance value of the resistor circuit 16 becomes that of the parallel connected resistors R1 and R3.

Figure 2C:
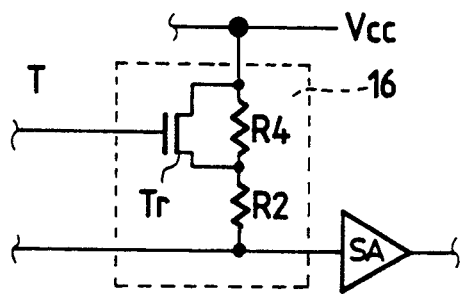
Figure 2D:
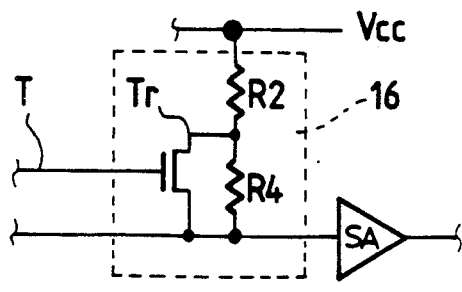

In FIGS. 2c and 2d, the resistor circuit 16 comprises a series connection of resistors R2 and R4 connected between the power source Vcc and the input of the sense amplifier SA and a transistor Tr connected in parallel to the resistor R4. A resistance value of the resistor R4 is set to the resistance value of the resistor R1 in FIG. 2a or 2b reduced by that of the resistor R2. In FIG. 2c, the resistor R4 is arranged in the power source side and, in FIG. 2d, the resistor R2 is arranged in the power source side. In either FIG. 2c or 2d, when there is no test selection signal T, the transistor Tr is in the OFF state and therefore the resistance value of the resistor circuit 16 is that of the series connected resistors R2 and R4, that is, the resistance value of the resistor R1. When the test selection signal T is supplied to the gate electrode of the transistor Tr, the latter is turned ON and the resistance value of the resistor circuit 16 becomes that of the resistor R2.

These circuits shown in FIG. 2 are mere examples and any other circuit construction of the resistor circuit 16 can be used so long as it has a function of changing its resistance value in response to the test selection signal T. For example, by making a channel length of the transistor Tr in any circuit shown in FIG. 2 large to make the resistance value of the transistor Tr in an ON state equal to that of the resistor R3 or R4, the resistor circuit 16 can be constructed with only the addition of transistor Tr. Further, it is possible to constitute the resistor circuit 16 with a transistor and a resistor having resistance value equal to that of the resistor R1, or with an ON/OFF transistor, a transistor having the same resistance value as that of the resistor R4 and a resistor having the same resistance value as that of the resistor R2. Further, it is also possible to constitute the respective resistors with transistors.

In the PROM IC constructed as mentioned above, the test circuit can be effectively used after it is packaged. By setting the value of the external voltage E according to content of the test, the IC can be tested for evaluation during fabrication process or prior to shipping, against severely selected criteria. Further, even when the IC is in use, it is possible to perform tests such as a read-verify test against severely selected criteria by program processing within a device.

Although, in the above embodiments, the marginal test with threshold voltage of 0 V has been described as an example, the present invention is neither limited thereto nor to the performance test with the reduced resistance value of the pull-up resistor. That is, it is enough in the latter case to switch the resistance value of the pull-up resistor such that the condition as to the current drive capability of the memory cell becomes severe according to the test content.

While a preferred embodiment has been set forth with specific details, further embodiments, modifications and variations are contemplated according to the broader aspects of the present invention, all as determined by the spirit and scope of the following claims.

What is claimed is:

1. A PROM IC comprising:
a plurality of memory cells;
means responsive to an address signal for selecting one of said memory cells;
a reading voltage application circuit responsive to a test selection signal for switching a reading voltage to be applied to said selected one of said memory cells from a predetermined voltage to an externally supplied voltage to read an information written therein;
sense circuit means for binarizing a read signal from said selected one of said memory cells;
resistor circuit means included in said sense circuit means on the side of an input thereof for pulling-up a potential of said input, said resistor circuit means being responsive to said test selection signal to change its resistance value from a first value to a second value with which drive condition of current flowing through said selected memory cell becomes severe;
wherein each said memory cell comprises a floating gate type transistor and wherein said second value of said resistor circuit means is smaller than said first value; and
wherein said predetermined voltage applied to said gate of said transistor is 0 V and wherein said first resistance value is in a range from several hundreds k to several M ohms and said second resistance value is in a range from several k to several tens k ohms.

2. The PROM IC claimed in claim 1, wherein said resistor circuit means comprises a plurality of resistors and a transistor which is responsive to said test selection signal to turn ON or OFF to thereby change said resistance value of said resistor circuit means.

3. A PROM IC comprising:
a plurality of memory cells;
address decoder means responsive to an address signal for selecting one of said memory cells corresponding to said address signal;
a reading voltage application circuit responsive to a test selection signal for changing said reading voltage from a standard reading voltage to an externally supplied voltage and for applying said externally supplied voltage to said memory cell selected by said address decoder means;

a sense circuit including a sense amplifier and a resistor circuit arranged on the side of an input of said sense amplifier and providing a resistance value variable in response to said test selection signal, a potential of said input of said sense amplifier being pulled-up by a power source through said resistor circuit to detect an information stored in said selected memory cell and, in response to said test selection signal, change said resistance value of said resistor circuit from a first value for a usual use of said memory cell to a second value with which drive condition of current flowing through said selected memory cell becomes severe;

wherein said memory cell comprises a floating gate type transistor and wherein said second resistance value of said resistor circuit is smaller than said first resistance value; and wherein said resistor circuit comprises a plurality of resistors and a transistor which is responsive to said test selection signal to turn ON or OFF to thereby change said resistance value of said resistor circuit means.

4. The PROM IC claimed in claim 3, wherein said plurality of said resistors comprise transistors, respectively.

* * * * *